United States Patent [19]

Binsma et al.

[11] Patent Number: 5,266,518
[45] Date of Patent: Nov. 30, 1993

[54] METHOD OF MANUFACTURING A SEMICONDUCTOR BODY COMPRISING A MESA

[75] Inventors: Johannes J. M. Binsma; Rudolf P. Tijburg, both of Eindhoven, Netherlands

[73] Assignee: U.S. Philips Corporation, New York, N.Y.

[21] Appl. No.: 576,317

[22] Filed: Aug. 29, 1990

[30] Foreign Application Priority Data

Sep. 14, 1989 [NL] Netherlands ............... 8902292

[51] Int. Cl.⁵ .................................. H01L 21/308
[52] U.S. Cl. .................................. 437/129; 437/228; 437/947; 437/958; 437/981; 156/649
[58] Field of Search ............... 437/127-133, 437/228; 148/981; 357/16-17

[56] References Cited

U.S. PATENT DOCUMENTS

| | | | |
|---|---|---|---|
| 4,417,385 | 11/1983 | Temple | 437/985 |
| 4,679,305 | 7/1987 | Morizuka | 357/16 |
| 4,792,958 | 12/1988 | Ohba et al. | 357/17 |

FOREIGN PATENT DOCUMENTS

| | | | |
|---|---|---|---|
| 0233725 | 8/1987 | European Pat. Off. | 437/127 |
| 3038277 | 2/1988 | Japan | 437/133 |

OTHER PUBLICATIONS

IBM Technical Disclosure Bulletin "Gating Assenic Gate Field Effect Transistor Process Utilizing self-Aligned Epitaxial Contacts", vol. 31, No. 1, Dec. 1988, pp. 11-13.

*Primary Examiner*—Olik Chaudhuri
*Assistant Examiner*—Richard A. Booth
*Attorney, Agent, or Firm*—Paul R. Miller

[57] ABSTRACT

In the method according to the invention, the upper and thicker of two semiconductor layers is etched by means of a selective and preferential etchant, substantially no underetching occurring with respect to the mask. Subsequently, the lower and thinner semiconductor layer and a part of the upper semiconductor layer are converted by a substantially non-selective anodic oxidation into semiconductor material oxides, which are removed by means of an etchant which is non-selective with respect to the oxides formed, but is selective with respect to the semiconductor materials. As a result, mesas are obtained having a substantially flat side wall, the lateral dimension of these mesas being accurately determined by the size of the mask. Thus, particularly favourable results are obtained, especially in the InP/InGaAsP material system. The method according to the invention can be used very advantageously when the thinner layer forms part of a so-called multilayer quantum well structure.

19 Claims, 3 Drawing Sheets

METHOD OF MANUFACTURING A SEMICONDUCTOR BODY COMPRISING A MESA

The invention relates to a method of manufacturing a semiconductor body, in which there is provided on a semiconductor substrate a semiconductor layer structure comprising at least a first semiconductor layer consisting of a first semiconductor material and a second semiconductor layer provided thereon consisting of a second semiconductor material other than the first semiconductor material, while the thickness of the first semiconductor layer is chosen to be comparatively small with respect to the thickness of the second semiconductor layer, after which a mesa comprising at least the first and the second semiconductor layer is formed by etching and by means of a mask in the semiconductor layer structure, a wet-chemical etchant being used for removing the second semiconductor layer.

Such a method is particularly suitable for manufacturing so-called buried hetero-junction semiconductor diode lasers, more particularly if the latter are wholly manufactured by means of OMVPE (=Organo-Metallic Vapour Phase Epitaxy) as the growing technique. In this manner, buried or unburied radiation guides may also be manufactured. If such a method is used with the material system InP/InGaAsP, radiation sources, radiation guides etc. are obtained thereby, which are of great importance for glass fiber communication systems in the wavelength range of from 1 to 1.6 $\mu$m.

BACKGROUND OF THE INVENTION

Such a method is known from the article of S. Adachi et al entitled "Chemical Etching of InGaAsP/InP DH Wafer", published in Journal of Electrochemical Society, Vol. 129, No. 5, May 1982, pp. 1053-1062. In this article, a method is described of manufacturing mesas in a semiconductor layer structure comprising a comparatively thin first semiconductor layer of InGaAsP between two semiconductor layers of InP, the upper layer of which constitutes the second semiconductor layer. In this case, the semiconductor layers are removed by selective or non-selective wet-chemical etchants, such as HCl and mixtures thereof with $H_2O$, $H_2O_2$, $CH_3COOH$ or $H_3PO_4$, which are selective etchants for InP, mixtures of $H_2SO_4$, $H_2O_2$ and $H_2O$, which are selective etchants for InGaAsP, and mixtures of HCl and $CH_3COOH$ or $H_3PO_4$ to which $H_2O_2$ is added, or mixtures of $Br_2$ and $CH_3OH$, which are non-selective etchants, by which therefore both InP and InGaAsP can be etched. When etching a mesa, use is made of a mask layer comprising $SiO_2$.

As has been found in practice, a disadvantage of the known method is that with a number of the etchants used therein, especially the non-selective etchants, such as mixtures of $Br_2$ and $CH_3OH$, the known method results in under-etching with respect to the mask. As a result, an accurate definition of the width of the mesa at the area of the first semiconductor layer is impeded because in this case this width depends upon the thickness of the second semiconductor layer. Due to this inaccurate width definition, a number of important properties of, for example, radiation guides or semiconductor diode lasers of which the mesa forms part are undetermined, which is undesirable. Such properties are, for example, the lateral mode in which the radiation is situated and the starting current of a semiconductor diode laser. With some other non-selective etchants, such as mixtures of HCl and $HNO_3$, the problem sometimes arises that they do not or substantially do not etch InP. If in the known method solely selective etchants are used, another problem arises, which is connected with the fact that the first semiconductor layer is comparatively thin with respect to the second semiconductor layer. It is difficult to accurately etch away this comparatively thin layer because the etchant is a wet-chemical etchant whose etching rate depends upon a large number of factors, such as the accurate composition of the semiconductor layer and the etchant, the temperature of the etchant etc. If the first semiconductor layer must be effectively etched away, that is to say that outside the mesa nothing is left of this layer at any place, some under-etching must be accepted. Due to the under-etching and especially due to the uncertainty with respect to the extent of this underetching, the width of the mesa at the area of the first semiconductor layer becomes uncertain. As a result, the same disadvantages are obtained as mentioned above for etching with non-selective etchants. If in the known method the semiconductor layers are removed alternately by a known chemical etchant etching selectively and by a known chemical etchant etching non-selectively, the aforementioned problems still arise, though to a smaller extent. In parctice, mesas are often desired whose sidewalls are substantially flat, i.e. substantially not curved. For example, the width of a mesa in the direction of height of the mesa varies in an accurately defined manner, as a result of which the aforementioned problems of an undefined width at the area of the first semiconductor layer are smaller. More particularly, these problems substantially do not arise if the mesa has substantially straight sidewalls. Moreover, such flat sidewalls are often very suitable if, for example, by means of the OMVPE growing technique other semiconductor layers are provided beside the mesa. These flat sidewalls are often obtained by utilizing preferential etchants. An additional disadvantage of the known method in this case arises if several etchants are used for etching the mesa and one of these etchants does not etch preferentially or does not etch preferentially in the same manner as one of the other etchants. For example, it has been found that, if the second semiconductor layer comprises InP and the first semiconductor layer comprises InGaAsP and the second semiconductor layer is etched by means of a mixture of HCl and $H_3PP_4$, a mesa is obtained having substantially flat and straight sidewalls at the area of the layer. If subsequently the first semiconductor layer is etched by means of an etchant comprising a mixture of $Br_2$ and $CH_3OH$, in spite of the comparatively small thickness of the layer to be etched, the shape of the mesa is attacked due to the fact that also the second semiconductor layer is etched in such a manner that the flatness of the side edge of the mesa at the area of the layer disappears. At the same time, some under-etching occurs with respect to the mask. Finally, the disadvantage has to be mentioned that several chemical etchants give rise to a large under-etching at the area of the interface between the mask and the second semiconductor layer.

SUMMARY OF THE INVENTION

The present invention has inter alia for its object to provide a method, by which mesas are formed having substantially flat sidewalls throughout the height of the mesa, the dimensions of the mesas at the area of the first semiconductor layer being accurately determined by the size of the mask, while not more than a small under-etching occurs.

A method of the kind described in the opening paragraph is for this purpose characterized in that, when removing the second semiconductor layer, a selective and preferential etchant is used, while substantially no under-etching occurs with respect to the mask and, before the first semiconductor layer is removed, the semiconductor material of the first layer and that of a part of the second semiconductor layer are converted by substantially non-selective anodic oxidation into semiconductor material oxides, after which the latter are removed by means of an etchant, which is non-selective with respect to the semiconductor material oxides and is selective with respect to the semiconductor materials. The term "semiconductor material oxide" is to be understood to mean a mixture of one or more oxides or oxygen-containing compounds of those elements which form part of the semiconductor material. Since the height of the mesa to be formed is mainly determined by the second semiconductor layer, when etching the latter by means of a selective and preferential etchant, a mesa is obtained having substantially flat sidewalls. Moreover, the thin first semiconductor layer can be removed without underetching with respect to the second semiconductor layer because the anodic oxidation takes place substantially non-selectively. Since the part of the second semiconductor layer converted into semiconductor material oxide has, viewed in the lateral direction, only a small width, which is very uniform over the thickness of the second semiconductor layer, after the semiconductor material oxide has been removed, a mesa, is thus obtained, whose shape and dimension, viewed in the lateral direction, are accurately maintained. For dissolving the different semiconductor material oxides formed, an etchant is used which is non-selective with respect to these oxides and is selective with respect to the semiconductor material. By the method according to the invention, a mesa is obtained having substantially flat walls with a small under-etching with respect to the mask, whose dimensions, viewed in the lateral direction, are very accurately determined by the dimensions of the mask and which does not or substantially does not exhibit at the area of the first semiconductor layer a part of reduced width. The semiconductor material oxides can be removed in a separate bath or at the same time with the anodic oxidation in the bath used to this end. An additional advantage of the method according to the invention is that the first semiconductor layer can be removed in a very accurate and reproducible manner because the thickness of the layer comprising semiconductor material oxide is determined not by an etching time, but by a voltage applied.

In a first embodiment of a method according to the invention, the first and the second semiconductor material are chosen so that the band gap of the first semiconductor material is smaller than the band gap of the second semiconductor material, while, before the first semiconductor material is provided, a third semiconductor layer of the second semiconductor material is provided and the mesa is formed at least into the third semiconductor material, while, after the first semiconductor layer has been etched, the third semiconductor layer is etched by means of a selective and preferential etchant. Thus, mesas are obtained in which a double hetero-junction structure is present and which have a substantially flat side edge. These mesas are particularly suitable for use as radiation guides or as starting material for the manufacture of buried radiation guides or semiconductor diode lasers. If the starting material is a semiconductor substrate having a (001) crystal orientation and if the crystal direction is chosen as the longitudinal direction of the mesas to be formed, mesas are obtained having substantially flat side walls substantially at right angles to the semiconductor layer structure. These mesas having a substantially rectangular cross-section have proved to be particularly suitable for the manufacture of radiation guides or semiconductor diode lasers, in which beside the mesa one or more further semiconductor layers are grown by means of OMVPE. More particularly in the InP/InGaAsP material system, buried semiconductor diode lasers having favourable properties, such as a low starting current and a long life and a small spread in the aforementioned properties can be manufactured by the method according to the invention.

In a further embodiment of a method according to the invention, the mask by means of which the second semiconductor layer is etched is formed in a layer provided on the second semiconductor layer and etched away locally by means of a further mask. In deviation from the situation in which a photolacquer is used as a mask, the material of the layer forming the mask is now chosen freely in such a manner that the mask is not etched by the etchant of the second semiconductor layer and further that the stress produced between the mask and the second semiconductor layer is as small as possible, as a result of which the occurrence of under-etching remains limited. In practice, for example, a layer of silicon nitride provided by plasma CVD (=Chemical Vapour Deposition) has proved to be particularly suitable. In a variation of this embodiment, a fourth semiconductor layer is used as a mask-forming layer. If, for example, in the InP/InGaAsP material system, a fourth semiconductor layer is chosen to this end which comprises InGaAsP, this fourth layer can be accurately under-etched preferably by means of a selective etchant for such a semiconductor layer with respect to a further mask present on the semiconductor layer. The under-etching of the fourth semiconductor layer with respect to the further mask can be accurately adjusted because it can be observed in a simple manner, for example under a light microscope. In this manner, the lateral dimensions of the mesa to be formed can be accurately adjusted. If the crystal lattice of the fourth semiconductor layer accurately adjoins the crystal lattice of the second semiconductor layer, in a method according to the invention, in which the second semiconductor layer is etched by means of a selective and preferential etchant, substantially no under-etching of the second semiconductor layer is found with respect to the mask formed in the fourth semiconductor layer. Moreover, the fourth semiconductor layer can excellently be used as a contact-forming layer for a semiconductor diode laser to be formed. The second semiconductor layer, which comprises, for example, InP, is generally less suitable for this purpose. With the use of the method according to the invention, in which a fourth semiconductor layer is employed as a mask-forming layer, when removing the first semiconductor layer, the fourth semiconductor layer will be removed to the same small extent as the second semiconductor layer in the lateral direction, which results in the aforementioned advantages.

If the further mask is formed, for example, by a layer comprising silicon dioxide or silicon nitride and if the lateral dimensions, for example the width, of the further mask are chosen to be larger than the desired corresponding dimension of the mask, the further mask projects, after the mask has been formed by etching, beyond the mask. Such a configuration has proved to be particularly suitable in practice if other semiconductor layers are provided beside the mesa by means of OMVPE. In this manner, substantially flat buried hetero-semiconductor diode lasers are obtained. The flatness of such a laser is a great advantage when metallizing and finishing the latter.

In an important embodiment of a method according to the invention, the thickness of the first semiconductor layer is chosen to be smaller than 0.2 μm. This thickness range is particularly suitable for the manufacture of semiconductor diode lasers and radiation guides. More particularly a method according to the invention is suitable for the manufacture of mesas, which comprise a multilayer quantum well structure, of which the first semiconductor layer forms part. If such a multilayer structure is etched by means of selective wet-chemical etchants for the layers forming a barrier and the layers forming a quantum well, respectively, a mesa is obtained having a comb shape in a sectional view at the area of the multilayer structure. When etching the nth layer of such a structure, also the $(n-2)^{th}$, the $(n-4)^{th}$ layers etc. are etched again. As a result, the width of the multilayer structure will vary very strongly, which is undesirable. An additional disadvantage of this known method is that the etchant must often be changed, which is very cumbersome. Moreover, in this case the probability of errors and contamination of the etchants or the semiconductor body increases.

The anodic oxidation of the first semiconductor layer, when it comprises InGaAsP or InGaAs as semiconductor material, can be very readily effected in a 3% solution of citric acid in water, of which the pH is brought to about 6 by means of $NH_4OH$, diluted with 2 parts of ethylene glycol. The semiconductor material oxide formed may be dissolved, for example, with a 1.5 molar solution of phosphoric acid in water. The anodic oxidation and the dissolution of the oxide formed may also be effected simultaneously in one medium. For this purpose, use may be made of a 3% solution of citric acid in water, of which the pH is brought to about 1.0 by means of $H_3PO_4$, diluted with 2 parts of ethylene glycol. If the second and third semiconductor layers comprise InP as semiconductor material, preferably a solution of hydrochloric acid and phosphoric acid in a ratio of 1 : 4 is used as selective etchant, while for selectively etching a layer comprising InGaAsP use is preferably made of an etchant comprising sulphuric acid, hydrogen peroxide and water in a ratio of 1 : 1 : 9.

BRIEF DESCRIPTION OF THE DRAWING FIGURES

A further explanation of the invention will now be given with reference to two embodiments and the accompanying drawing, in which.

Figure 1:
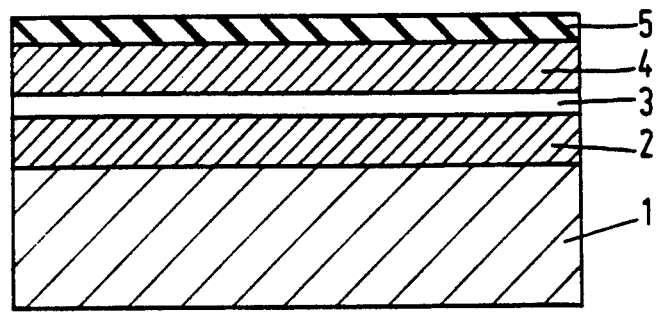
FIGS. 1, 2, 3 and 4 show a first embodiment of a method according to the invention for the manufacture of a radiation guide with reference to a cross-section of the radiation guide at successive stages of the manufacture.
Figure 2:
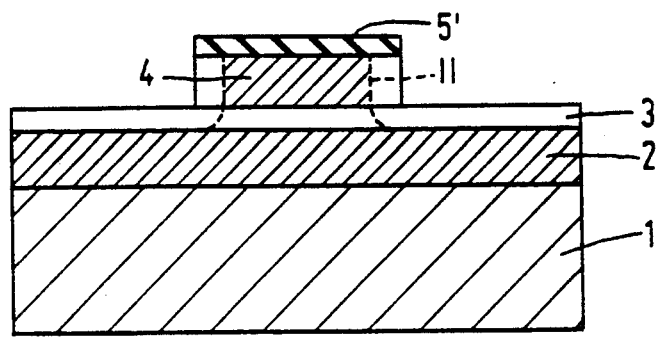
Figure 3:
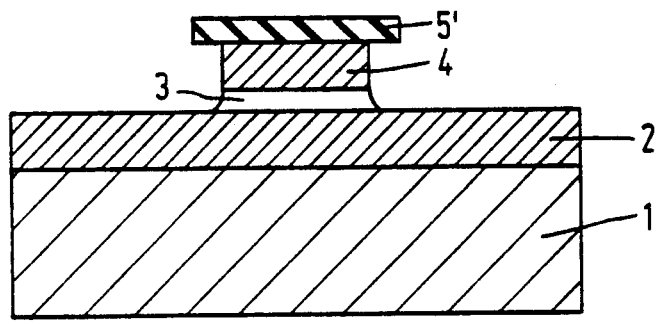
Figure 4:
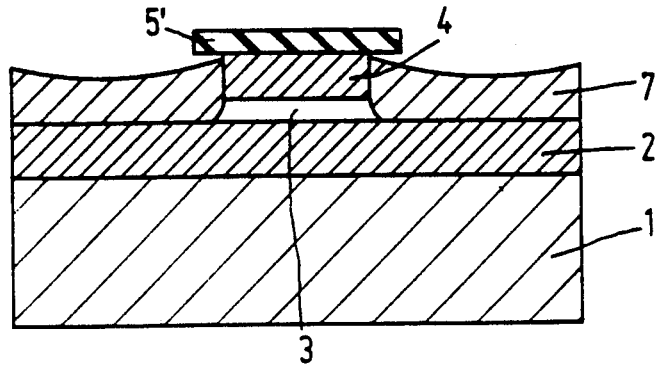
Figure 5:
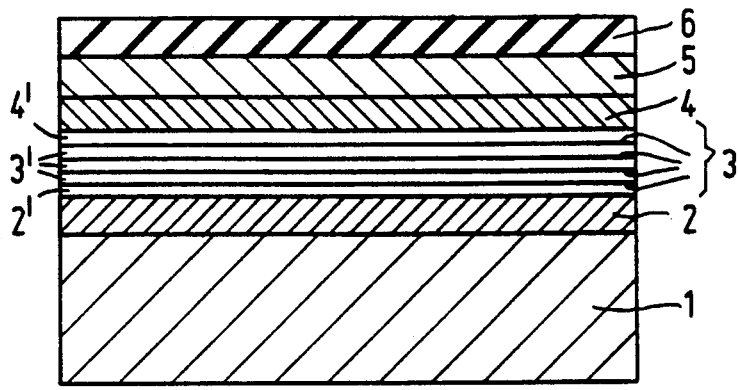
FIGS. 5, 6, 7, 8, 9 and 10 show a second embodiment of a method according to the invention for the manufacture of a buried multilayer quantum well semiconductor diode laser, in which OMVPE is used as growing technique, with reference to a cross-section of the buried semiconductor diode laser at successive stages of the manufacture.
Figure 6:
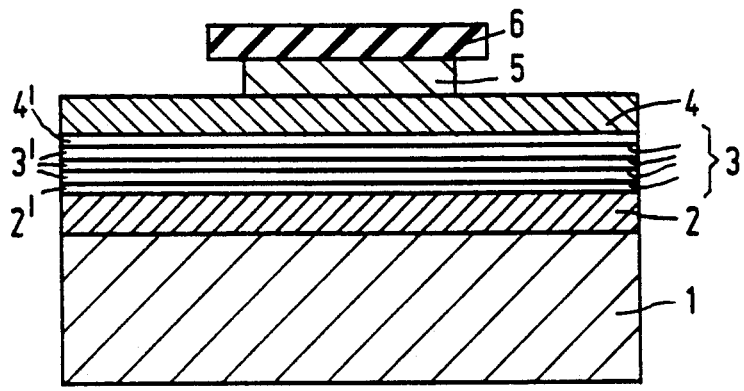
Figure 7:
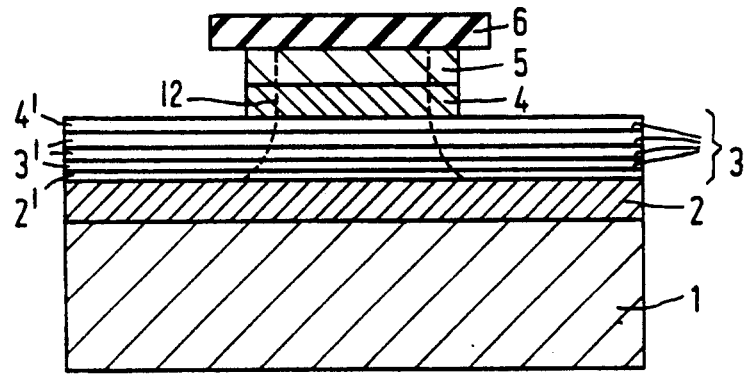
Figure 8:
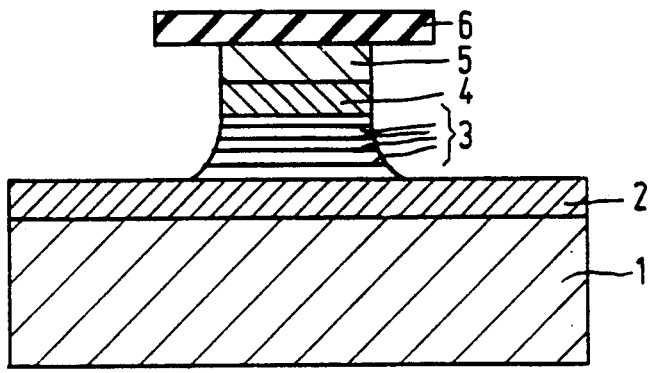

The Figures are schematic and not drawn to scale, while for the sake of clarity especially the dimensions in the direction of thickness are exaggerated. Corresponding parts are generally designated by the same reference numerals in the various embodiments. Semiconductor regions of the same conductivity type are generally cross-hatched in the same direction.

DESCRIPTION OF THE INVENTION

FIGS. 1 to 4 show a first embodiment of a method according to the invention for the manufacture of a radiation guide, which is shown in cross-section at successive stages of the manufacture. The starting material is a substrate 1 of monocrystalline n-type InP having a doping concentration of $2 \times 16^{18}$ to $5 \times 10^{18}$ at/$cm^3$, a thickness of about 350 μm and a (001) orientation. After the surface has been polished and etched, there are successively grown on this surface, for example by means of OMVPE: an about 1 μm thick layer 2 of D-type InP having a doping concentration of $10^{18}$ at/$cm^3$, an about 0.15 μm thick layer 3 of not intentionally doped InGaAsP having an In content of 83 at.% and an As content of 60 at.% corresponding to a wavelength of 1.3 μm, and an about 1.0 μm thick layer 4 of D-type InP having a doping concentration of $10^{18}$ at/$cm^3$. By means of plasma CVD, a 0.15 μm thick layer 5' of $Si_3N_4$ is provided thereon (see FIG. 1). By means of photolithography and etching, a strip-shaped mask, whose longitudinal direction coincides with the [110] crystal direction of the semiconductor body and is at right angles to the plane of the drawing, is then formed in the layer 5', after which by etching by means of a selective and preferential etchant for InP comprising hydrochloric acid and phosphoric acid in a ratio of 1 : 4 at room temperature (etching rate = about 0.7 μm/min) the layer 4 comprising InP is locally removed without under-etching with respect to the mask formed in the layer 5'. By means of anodic oxidation at a current density of 2 mA/$cm^2$, the region of the semiconductor body designated by reference numeral 11 is then removed in a solution of citric acid, whose pH is brought to about 1 by means of phosphoric acid, diluted with two parts of ethylene glycol. According to the invention, no under-etching of the semiconductor layer 3 then occurs with respect to the overlying semiconductor layer 4 because the etching step is carried out non-selectively. Due to the fact that the semiconductor layer 3 is comparatively thin, only a small quantity of material of the semiconductor layer 4 is removed and the size and shape of the mesa are substantially maintained (see FIG. 3). Subsequently, by means of OMVPE, an D-type semiconductor layer 7 of InP having a thickness of about 2 μm and a doping concentration of about $10^{18}$ at/$cm^3$ is provided beside the mesa. After the semiconductor body has been cleft several times in a direction at right angles to the longitudinal direction of the mesa, mirror surfaces lying in the plane of the drawing then being formed, the radiation guides, which are particularly suitable for transport of radiation having a wavelength of from 1.3 to 1.5 μm, are ready (see FIG. 4).

FIGS. 5 to 10 show a second embodiment of a method according to the invention of manufacturing a buried semiconductor diode laser, in which OMVPE is used as growing technique, with reference to a cross-section of the buried semiconductor diode laser at successive stages of manufacture. The starting material is a substrate 1 of monocrystalline D-type InP having a doping concentration of $2 \times 10^{18}$ to $5 \times 6^{18}$ at/cm$^3$, a thickness of about 350 μm and a (001) orientation. After the surface have been polished and etched, there are successively grown on this surface, for example by means of OMVPE: an about 1 μm thick layer 2 of D-type InP having a doping concentration of $5 \times 10^{17}$ at/cm$^3$, a first SC (=Separate Confinement) layer 2 of InGaAsP having an In content of about 73 at.% and an As content of about 60 at.%, which composition corresponds to a wavelength of 1.3 μm for bulk material and whose thickness is about 500 Å, four thin layers 3 forming a quantum well and comprising InGaAs having an In content of about 53 at.% corresponding to a wavelength of 1.65 μm for bulk material and having a thickness of about 75 Å, which are mutually separated by three thin layers 3' forming a barrier and comprising InGaAsP having a composition corresponding to that of the first SC layer 2' and having a thickness of about 50 Å, a second SC layer 4' having the same thickness and composition as the first SC layer 2', an about 1.0 μm thick layer 4 of p-type InP having a doping concentration of about $5 \times 10^{17}$ at/cm$^3$ and an about 0.2 μm thick layer 5 of p-type InGaAsP having a doping concentration of at least about $5 \times 10^{18}$ at/cm$^3$ and having an In content of 73 at.% and an As content of 60 at.% corresponding to a wavelength of 1.3 μm. Subsequently, by means of the sputtering technique, a 0.15-3 um thick layer 6 of SiO$_2$ is provided thereon (see FIG. 5). By means of photolithography and etching, a strip-shaped further mask having a width of about 4 μm, whose longitudinal direction coincides with the [110] crystal direction of the semiconductor body and is at right angles to the plane of the drawing, is then formed in the layer 6, after which the layer 5 comprising InGaAsP is locally removed by etching at 20° C. by means of a selective etchant for InGaAsP comprising sulphuric acid, hydrogen peroxide and water in a ratio of 1 : 1 : 9 (etching rate =about 0.1 μm/min), with under-etching with respect to the further mask formed in the layer 6. The resulting width of the mask formed in the semiconductor layer 5 is about 2 μm (see FIG. 6). Subsequently, the semiconductor layer 4 is locally removed by etching by means of the selective etchant for InP mentioned in the preceding example without under-etching with respect to the mask formed in the layer 5 (see FIG. 7). By the method according to the invention, the region designated by reference numeral 12, which comprises the four layers 3 forming a quantum well, the three layers 3' forming a barrier and the SC layers 2' and 4', is converted by means of anodic oxidation in a manner described in a preceding example into semiconductor material oxide, after which the latter is removed by an etchant which is non-selective with respect to the semiconductor material oxide formed and is selective with respect to the semiconductor material (see FIG. 8). Since the semiconductor materials used are not or substantially not attacked by the last-mentioned etchant, the etching process is stopped at the instant at which the semiconductor material oxide is entirely removed so that this etching step is not critical. According to the invention, substantially no under-etching of one of the semiconductor layers 2', 3, 3' and 4' occurs because both the anodic oxidation and the dissolution of the oxides are effected non-selectively. Due to the fact that the latter semiconductor layers are very thin, only a very small quantity of semiconductor material need be removed and the size and shape of the mesa are accurately maintained (see FIG. 8). Subsequently, the semiconductor layer 2 is locally removed by etching by means of the selective etchant for InP mentioned in the preceding example substantially without under-etching with respect to the mask formed in the layer 5 (see FIG. 9). Subsequently, by means of OMVPE, there are successively provided beside the mesa a p-type InP semiconductor layer 8 having a thickness of about 0.8 μm and a doping concentration of about $5 \times 10^{17}$ at cm$^3$, an type InP semiconductor layer 9 having a thickness of about 0.6 μm and a doping concentration of about $5 \times 10^{17}$ at/cm$^3$ and a p-type InP semiconductor layer 10 having a thickness of about 0.6 μm and a doping concentration of about $8 \times 10^{17}$ at/cm$^3$, which layers form due to the conductivity types chosen a current blocking structure with respect to a connection in the forward direction of the semiconductor layer structure located within the mesa. Due to the presence of the further mask 6 projecting beyond the mesa, a very uniform accurately adjoining and flat growth of the semiconductor layers 8, 9 and 10 is obtained beside the mesa, while no growth takes place on the further mask 6. After this further mask has been removed in a usual manner, a substantially flat structure is obtained (see FIG. 10), which is very advantageous for further treatments, such as metallization and mounting. After the lower and upper sides of the semiconductor body have been metallized in a usual manner and after the semiconductor body has been cleft several times in a direction at right angles to the longitudinal direction of the mesa, mirror surfaces lying in the plane of the drawing being formed, the resulting semiconductor diode lasers of the buried heterojunction type are ready to be finished. Such lasers are particularly suitable for use as a radiation source utilized in optical glass fiber communication systems.

Figure 9:
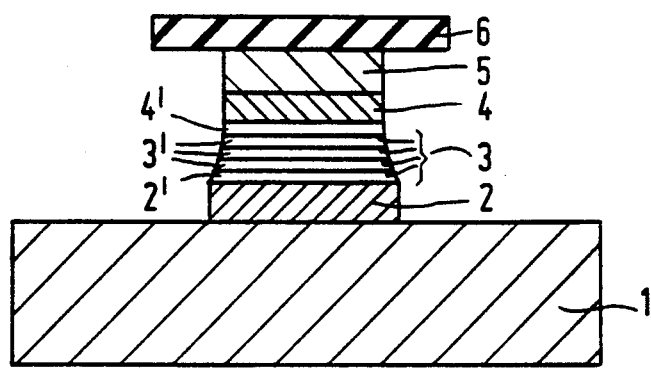
Figure 10:
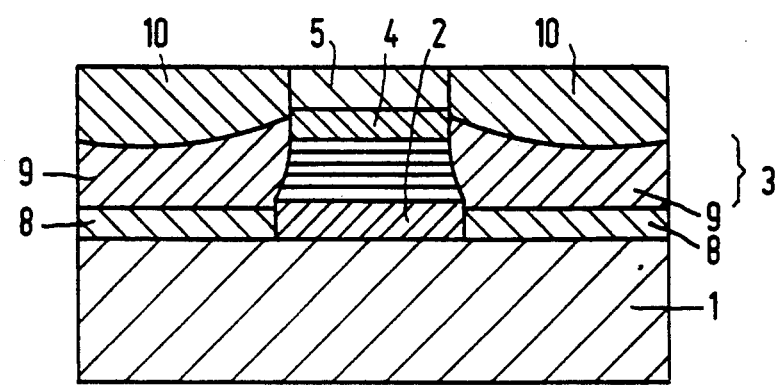
Figure 11:
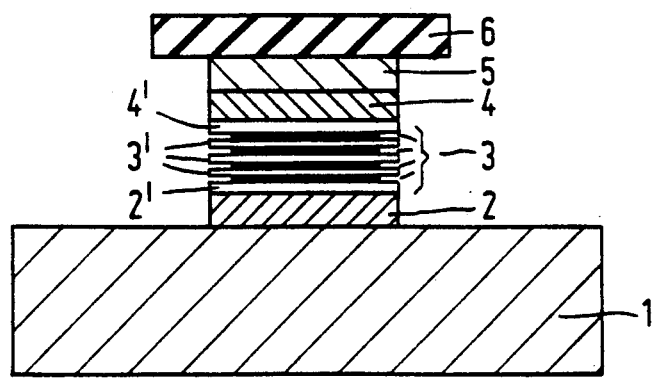
FIG. 11 shows the stage corresponding to FIG. 9 with the use of the known method, in which solely selective wet-chemical etchants are used.

FIG. 11 shows the stage corresponding to FIG. 9 with the use of the known method, in which solely selective etchants are employed. For etching the layers 3 forming a quantum well and the layers 3' forming a barrier, alternately the aforementioned selective etchants for InGaAsP and for InP (or similar selective etchants) are used. Due to the problems of such a method set out above, a comparatively and variable under-etching occurs at the area of the thin layers 3 and 3'. The resulting (irregular) comb structure has the disadvantage that the width of the active layer of a semiconductor diode laser to be formed becomes very uncertain. The disadvantages thereof have already been set out above. If the number of layers 3, 3' is large, there is even a possibility that the upper layers 3, 3' are fully etched away, the overlying part of the mesa then becoming detached.

The invention is not limited to the embodiments described because many modifications and variations are possible for those skilled in the art within the scope of the invention. For example, semiconductor materials or compositions other than those mentioned in the embodiments may be used. Instead of a multilayer quantum well structure comprising alternately layers of InGaAs and InGaAsP, the layers of such a structure may comprise alternately InGaAs or InGaAsP and InP. The same applies to the composition of the bath in which the anodic oxidation is carried out or to the etchant by means of which the resulting semiconductor material oxide is dissolved. The choice thereof is determined inter alia by the relevant semiconductor material system. Further, a current-blocking structure may consist of a single high-ohmic semiconductor layer. If such a layer comprises, for example, InP, this layer may be made high-ohmic in that during its growth Fe atoms are incorporated having a concentration of about $10^{16}$ at/cm$^3$. The invention is not limited either to a method of manufacturing mesas forming part of a radiation guide or a semiconductor diode laser. By a method according to the invention, not only (photo)diodes, but also transistors comprising a mesa may be manufactured. Inter alia the same advantages are then obtained as those obtained during the manufacture of the aforementioned devices.

We claim:

1. A method of manufacturing a semiconductor body comprising the steps of
   (a) providing a first semiconductor layer of a first semiconductor material on a semiconductor substrate
   (b) providing a second semiconductor layer of a second semiconducting material on said first semiconductor layer, said second semiconducting material being different than said first semiconducting material, said first semiconductor layer having a thickness smaller than the thickness of said second semiconductor layer,
   (c) forming a mask on at least said second semiconductor layer,
   (d) etching said second semiconductor layer about said mask with a wet chemical etchant, said etchant being a selective and preferential etchant providing no underetching of said second semiconductor layer beneath said mask,
   (e) converting a portion of said second semiconductor layer into semiconductor material oxide by a substantially non-selective anodic oxidation,
   (f) removing said semiconductor material oxide by etching with an etchant non-selective with said semiconductor material oxide but selective with said first and second semiconductive material, such that at least said second semiconductor layer is formed underetched beneath said mask with straight edges, and
   (g) etching said first semiconductor layer to form a mesa of at least said first and second semiconductor layers.

2. A method according to claim 1, further comprising before said step (a) a step of providing a third semiconductor layer of said second semiconductor material, wherein said mesa is formed at least into said third semiconductor layer, said third semiconductor layer being etched after said step (g) by a selective and preferential etchant, and wherein said first semiconductor material has a band gap smaller than a band gap of said second semiconductor material.

3. A method according to claim 2, wherein said step (g) is carried out to form said mesa in a strip-shape having a longitudinal direction in the [110] crystal direction, said mesa being provided with side walls substantially at right angles to said first, second and third semiconductor layers.

4. A method according to claim 2, wherein said step (c) is carried out by depositing a layer of an insulator material and by etching a strip-shape of said insulator material.

5. A method according to claim 4, wherein said layer of insulator material is silicon nitride deposited by CVD.

6. A method according to claim 2, further comprising after step (b) the step of providing a fourth semiconductor layer of said first semiconductor material; said step (c) being carried out on said fourth semiconductor layer, wherein said steps (d), (e) and (f) are also carried out on said fourth layer such that said mask projects beyond said fourth, second and first semiconductor layers.

7. A method according to claim 6, wherein said first semiconductor layer is formed as a multilayer quantum well layer structure of a stack of thin semiconductor layers, each of said thin semiconductor layers, forming said quantum well structure, being surrounded by at least one semiconductor layer of a semiconductor material having a larger band gap than said thin semiconductor layers forming said quantum well.

8. A method according to claim 6, wherein said step (c) is carried out by depositing a layer of an insulator material and by etching a strip-shape of said insulator material.

9. A method according to claim 8, wherein said layer of insulator material is $SiO_2$ deposited by sputtering.

10. A method according to claim 6, wherein said fourth semiconductor layer is etched selectively with respect to said second semiconductor material.

11. A method according to claim 6, wherein said fourth semiconductor layer is formed of indium gallium arsenic phosphide, and wherein said fourth semiconductor layer is etched by an etchant including sulphuric acid, hydrogen peroxide and water in a ratio of 1:1:9.

12. A method according to claim 6, wherein said semiconductor substrate and said third semiconductor layer are formed of a first conductivity type, said second and said fourth semiconductor layers are formed of a second conductivity type, and said first semiconductor layer is not intentionally doped, and wherein after said step (g) is carried out, a current blocking structure is provided beside said mesa by forming a semi-isolating semiconductor layer or by forming at least two semiconductor layers providing a blocking p-n junction; contacts are respectively provided at a lower side of said semiconductor substrate and an upper side of said fourth semiconductor layer; the semiconductor body is cleft at right angles to said mesa; and mirror surfaces limiting said mesa are formed such that upon electrical connection in a forward direction laser operation is carried out with a portion of said first semiconductor layer within said mesa forming a resonant cavity to provide an active radiation-emitting region.

13. A method according to claim 11, wherein said semiconductor substrate is formed of indium phosphide, said first semiconductor material is one of indium gallium arsenic or indium gallium arsenic phosphide, and said second semiconductor material is formed of indium phosphide.

14. A method according to claim 13, wherein said indium phosphide is etched by an etchant including hydrochloric acid and phosphoric acid in a ration of 1:4.

15. A method according to claim 11, wherein at least one semiconductor layer is formed beside said mesa by Organo-Metallic Vapor Phase Epitaxy.

16. A method according to claim 11, wherein said first semiconductor layer is formed with a thickness of at most 0.2 $\mu$m.

17. A method according to claim 11, wherein said steps (e) and (f) are carried out simultaneously in a 3% solution of citric acid in water, having a pH of about 1 by addition of phosphoric acid, diluted with 2 parts of ethylene glycol.

18. A method according to claim 1, wherein said step (e) is carried out in a 3% solution of citric acid, having a pH of about 6 by addition of ammonia, diluted with 2 parts of ethylene glycol.

19. A method according to claim 17, wherein said step (f) is carried out by etching in a 1.5 molar solution of phosphoric acid.

* * * * *